(12) United States Patent
Takeda

(10) Patent No.: US 11,887,999 B2
(45) Date of Patent: Jan. 30, 2024

(54) PHOTODETECTOR

(71) Applicant: Nippon Telegraph and Telephone Corporation, Tokyo (JP)

(72) Inventor: Kotaro Takeda, Musashino (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 262 days.

(21) Appl. No.: 17/422,396

(22) PCT Filed: Jan. 15, 2020

(86) PCT No.: PCT/JP2020/001093
§ 371 (c)(1),
(2) Date: Jul. 12, 2021

(87) PCT Pub. No.: WO2020/149309
PCT Pub. Date: Jul. 23, 2020

(65) Prior Publication Data
US 2022/0130875 A1 Apr. 28, 2022

(30) Foreign Application Priority Data
Jan. 17, 2019 (JP) .................. 2019-005933

(51) Int. Cl.
*H01L 27/144* (2006.01)
*H01L 31/0232* (2014.01)
(Continued)

(52) U.S. Cl.
CPC ........ *H01L 27/1443* (2013.01); *H01L 31/024* (2013.01); *H01L 31/028* (2013.01); *H01L 31/02327* (2013.01); *H01L 31/103* (2013.01)

(58) Field of Classification Search
CPC ........... H01L 27/1443; H01L 31/02327; H01L 31/024; H01L 31/028; H01L 31/103; H01L 31/105
See application file for complete search history.

(56) References Cited

U.S. PATENT DOCUMENTS 8,067,687 B2 * 11/2011 Wanlass .............. H01L 31/0475 257/190
2003/0025962 A1 2/2003 Nishimura
(Continued)

FOREIGN PATENT DOCUMENTS

JP 2002-101051 A 4/2002
JP 2012-518202 A 8/2012
(Continued)

OTHER PUBLICATIONS

G. G. Macfarlane et al., *Fine Structure in the Absorption-Edge Spectrum of Ge*, Physical Review, vol. 108, No. 6, 1957, pp. 1377-1383.

*Primary Examiner* — Sitaramarao S Yechuri
(74) *Attorney, Agent, or Firm* — Workman Nydegger

(57) ABSTRACT

In a photodetector using GePDs, a photodetector having small change in light sensitivity due to temperature is provided. A photodetector includes a plurality of photodiodes formed on a silicon substrate and having germanium or a germanium compound in a light absorption layer, and two chips of integrated circuits arranged parallel to two sides connected to one corner of the silicon substrate, respectively, the two integrated circuits are connected to photodiodes formed on the silicon substrate, two or more of the photodiodes are arranged equidistantly from the integrated circuit that is parallel to one side connected to the one corner, and the numbers of equidistantly arranged photodiodes are equal, when viewed from the integrated circuits.

16 Claims, 17 Drawing Sheets

(51) Int. Cl.
*H01L 31/024* (2014.01)
*H01L 31/028* (2006.01)
*H01L 31/103* (2006.01)

(56) References Cited

U.S. PATENT DOCUMENTS

| | | | |
|---|---|---|---|
| 2008/0067324 A1* | 3/2008 | Heiler | H01L 27/14658 250/208.1 |
| 2010/0248399 A1* | 9/2010 | Hsieh | H01L 27/14636 438/455 |
| 2012/0106984 A1 | 5/2012 | Jones et al. | |
| 2012/0161018 A1* | 6/2012 | Shin | H01L 27/14658 250/370.09 |
| 2013/0221230 A1* | 8/2013 | Tredwell | G01T 1/20188 438/69 |
| 2015/0380457 A1* | 12/2015 | Fujii | G01T 1/241 378/19 |
| 2016/0337608 A1* | 11/2016 | Numata | H04N 25/583 |
| 2017/0040362 A1* | 2/2017 | Na | H01L 27/14605 |
| 2019/0198543 A1* | 6/2019 | Guo | H01L 27/14647 |

FOREIGN PATENT DOCUMENTS

| | | |
|---|---|---|
| JP | 2018-74104 A | 5/2018 |
| JP | 2018-82089 A | 5/2018 |

* cited by examiner

PHOTODETECTOR

TECHNICAL FIELD

The present invention relates to a photodetector that is used in an optical communication system or an optical information processing system, and more particularly, to a structure for providing a photodetector having a light sensitivity with a low temperature dependence.

BACKGROUND ART

With the spread of optical communication in recent years, there is a demand for cost reduction of optical communication devices. As one solution thereto, there is a method of forming a large number of optical circuits constituting an optical communication device on a wafer having a large diameter, such as a silicon wafer, at a time using a micro optical circuit technology such as silicon photonics. Thus, a material cost per chip can be dramatically reduced, and a cost of the optical communication device can be reduced.

A typical photodetector formed on a silicon (Si) substrate using such a technology includes a germanium photodetector (GePD) capable of monolithic integration.

FIG. 1 schematically illustrates a structure of a waveguide-coupled vertical GePD 100 of the related art. FIG. 2 is a cross-sectional view of a substrate taken along II-II of FIG. 1. In the GePD 100 of FIG. 1 in brief, light input from a waveguide layer 1101 at a left end reaches a Ge layer 114 that is a light absorption layer on a silicon slab 1102 and, when the light is absorbed, a photocurrent flows between an electrode 117 and electrodes 116 and 118 and light is detected.

In order to make a structure easy to understand, in FIG. 1, a clad layer 103 and a core layer 110 illustrated in a cross-sectional view of FIG. 2 are omitted, and only positions at which the electrodes 116 to 118 come into contact with silicon electrode portions 112 and 113 implanted with first impurities (for example, p-type) and a Ge region 115 implanted with second impurities of conductivity type (for example, n type) opposite to the first impurities are illustrated. The GePD 100 is formed on a silicon on insulator (SOI) substrate including a Si substrate, a Si oxide film, and a surface Si layer using a lithography technology or the like.

In a cross-sectional view of a substrate of FIG. 2, the GePD 100 includes a Si substrate 101, a lower clad layer 102 formed of a Si oxide film on the Si substrate, a core layer 110 that guides signal light, the Ge layer 114 that absorbs light formed on the core layer 110, and an upper clad layer 103 formed on the core layer 110 and the Ge layer 114. The core layer 110 in FIG. 2 corresponds to the waveguide layer 1101 and the silicon slab 1102 of FIG. 1.

A Si slab 111 implanted with first impurities and silicon electrode portions 112 and 113 doped with the first impurities at a high concentration and acting as electrodes are formed on the core layer 110 in FIG. 2. The Ge layer 114 is stacked by epitaxial growth on the Si slab 111 between the electrode portions 112 and 113, and the Ge region 115 doped with second impurities is formed on an upper portion of the Ge layer 114. The Ge layer 114 can also be a light absorption layer formed of a layer of a germanium compound, and is collectively referred to as a germanium layer. The electrodes 116 to 118 are included on the silicon electrode portions 112 and 113 and the Ge region 115, respectively, to come into contact with the silicon electrode portions 112 and 113 and the Ge region 115, and a photocurrent is detected.

When the light is incident on the silicon slab 1102 from the waveguide layer 1101 and absorbed by the Ge layer 114, a photocurrent flows between the electrode 117 and the electrodes 116 and 118 and thus, the GePD detects the light by detecting this current.

There also are horizontal GePDs as illustrated in FIGS. 3 and 4 in the related art. The horizontal GePD 100 of FIG. 3 includes a germanium region 121 implanted with first impurities and a germanium region 122 implanted with second impurities, instead of the p-type Si slab 111 implanted with the first impurities and the Ge region 115 doped with the second impurities of FIG. 2. The germanium regions 121 and 122 are separated by the Ge layer 114, and photocurrents are detected from the electrodes 116 and 118.

Another horizontal GePD 100 in FIG. 4 includes a silicon region 124$p$ implanted with first impurities, a silicon region 124$n$ implanted with second impurities, and a silicon electrode portion 125 doped with the second impurities at a high concentration and acting as an electrode, instead of the p-type Si slab 111 implanted with the first impurities and the Ge region 115 doped with the second impurities of FIG. 2. In a region 123 between the silicon region 124$p$ and the silicon region 124$n$, the Ge layer 114 is in contact with the core layer 110 over the two silicon regions, and a photocurrent is detected from the electrodes 116 and 118. In any of the horizontal GePDs, the Ge layer 114 can be a light absorption layer formed of a layer of a germanium compound and is collectively referred to as a germanium layer.

Further, in an optical communication system or an optical information processing system using GePDs, a single GePD is rarely used and about 2 to 8 GePDs are typically used side by side. This is because a plurality of PDs are necessary when as many GePDs as the number of wavelengths are necessary in a system adopting a wavelength division multiplexing (WDM) scheme using multiple wavelengths or when a balanced PD is used in a system adopting an optical digital coherent communication technology.

FIG. 5 illustrates an example of a configuration of an optical receiver of the related art that is used in an optical digital coherent communication technology. In this configuration, received polarized wave multiplex light input to a polarized wave separator 901 is separated into polarized waves, which are combined with local light of two different polarized waves emitted from a local light emitting source 900 in two optical hybrids 940 and 941. Eight GePDs 950A to 950H are used for photoelectric conversion of a total of eight output light beams including four light beams from each of the two optical hybrids 940 and 941.

CITATION LIST

Non Patent Literature

Non Patent Literature 1: G. G. Macfarlane, T. P. McLean, J. E. Quarrington and V. Roberts, "Fine Structure in the Absorption-Edge Spectrum of Ge", Phys. Rev. 108, 6 (1957) 1377-1383.

SUMMARY OF THE INVENTION

Technical Problem

However, the GePD 100 of the related art illustrated in FIGS. 1 to 4 has a problem that temperature characteristics of light sensitivity (characteristics of current output with respect to optical input power, which has units of A/W) are not constant.

FIG. 6 is a diagram obtained by plotting the sensitivity of photoelectric conversion for three temperatures when a reverse bias of 1.6 V is applied in a C band and an L band (wavelengths 1530 to 1565 nm and 1565 to 1625 nm, respectively) of a communication wavelength band of a GePD. For example, the sensitivity at 31° C. is substantially constant up to the vicinity of the C band, but the sensitivity decreases in the L band. This change in sensitivity is caused by change in a light absorption spectrum of germanium. At −5° C., the sensitivity tends to decrease even in the C band.

FIG. 7 illustrates temperature dependence of the light absorption spectrum of germanium itself (see Non Patent Literature 1). When a temperature becomes low, a bandgap of the germanium shifts to the high energy side. That is, an edge of the light absorption spectrum shifts to a short wavelength side. The edge of the light absorption spectrum of germanium that is used for a GePD is just around 1565 nm on the long wavelength side of the C band at 31° C. Therefore, even when a GePD shows constant sensitivity over the entire C band at 31° C., the sensitivity gradually decreases from the long wavelength side as the temperature decreases. This tendency is illustrated in FIG. 6 and the light sensitivity tends to decrease at −5° C., which is a low temperature, when the wavelength becomes longer.

The present invention has been made in view of such a problem, and an object of the present invention is to provide a photodetector having small change in light sensitivity by curbing change in a temperature of the GePD in a photodetector using GePDs.

Means for Solving the Problem

The present invention includes the following configurations in order to achieve such an object.

Configuration 1

A photodetector including
a plurality of photodiodes formed on a silicon substrate and including a germanium layer as a light absorption layer; and
two integrated circuits arranged parallel to two sides connected to one corner of the silicon substrate, respectively,
in which each of the two integrated circuits is connected to two or more photodiodes of the plurality of photodiodes formed on the silicon substrate,
an integrated circuit of the two integrated circuits is arranged equidistantly from each of the two or more photodiodes, and
the number of the two or more photodiodes corresponding to each of the two integrated circuits is equal.

Configuration 2

A photodetector including
a plurality of photodiodes formed on a silicon substrate and including a germanium layer as a light absorption layer; and
two or more integrated circuits monolithically integrated on the silicon substrate,
in which each of the two or more integrated circuits is connected to two or more photodiodes of the plurality of photodiodes formed on the silicon substrate,
an integrated circuit of the two or more integrated circuits is arranged equidistantly from each of the two or more photodiodes, and
the number of the two or more photodiodes corresponding to each of the two integrated circuits is equal.

Configuration 3

The photodetector according to configuration 1 or 2, in which a photodiode of the plurality of photodiodes includes
a silicon substrate;
a lower clad layer formed on the silicon substrate;
a silicon core layer formed on the lower clad layer and including a silicon region doped with impurities having a first conductivity type;
a silicon waveguide layer connected to the silicon core layer;
a germanium layer formed on the silicon core layer and including a region doped with impurities having a second conductivity type;
an upper clad layer formed on the silicon core layer and the germanium layer; and
electrodes connected to the silicon region and the region of the germanium layer, respectively.

Configuration 4

The photodetector according to configuration 1 or 2, in which a photodiode of the plurality of photodiodes includes
a silicon substrate;
a lower clad layer formed on the silicon substrate;
a silicon core layer formed on the lower clad layer;
a silicon waveguide layer connected to the silicon core layer;
a germanium layer formed on the silicon core layer and including two germanium regions doped with impurities having different conductivity types;
an upper clad layer formed on the silicon core layer and the germanium layer; and
electrodes connected to the two germanium regions of the germanium layer, respectively.

Configuration 5

The photodetector according to configuration 1 or 2, in which a photodiode of the plurality of photodiodes includes
a silicon substrate;
a lower clad layer formed on the silicon substrate;
a silicon core layer formed on the lower clad layer and including two silicon regions doped with impurities having different conductivity types;
a silicon waveguide layer connected to the silicon core layer;
a germanium layer formed over the two silicon regions on the silicon core layer;
an upper clad layer formed on the silicon core layer and the germanium layer; and
electrodes connected to the two silicon regions, respectively.

Configuration 6

The photodetector according to configuration 1 or 2, in which the integrated circuit includes a thermal conductor arranged to surround the two or more photodiodes connected to the integrated circuit, and
the thermal conductor is a metal or a highly thermal conductive material arranged in or on the upper clad layer.

Configuration 7

The photodetector according to any one of configurations 3 to 5,
in which the photodiode includes a heater for applying heat to the germanium layer, and
the heater is arranged in or on the upper clad layer.

Configuration 8

The photodetector according to any one of configurations 3 to 5, in which the photodiode includes a heater for applying heat to the germanium layer, and the heater is a linear conductive region formed in an upper portion of the silicon core layer.

Effects of the Invention

As described above, according to the present invention, it is possible to provide a photodetector having small change in light sensitivity by curbing change in a temperature of the GePD using the heat generated by the integrated circuits in a photodetector using GePDs.

DESCRIPTION OF EMBODIMENTS

In a photodetector based on silicon photonics of the present invention, at least two integrated circuits are arranged to surround at least one corner (angle) of a chip of a silicon photonics silicon substrate or are monolithically integrated on the silicon substrate. A plurality of GePD groups including a plurality of GePDs are arranged as light detection elements on the chip based on silicon photonics, and the integrated circuit and each GePD are arranged equidistantly and wired by electrodes. It is preferable for the number of GePDs arranged equidistantly corresponding to each integrated circuit to be equal. The integrated circuit is a circuit that generates heat, such as a transimpedance amplifier or driver having multiple channels, or a digital signal processor.

In the photodetector according to the present invention, the GePDs can be warmed and sensitivity can be prevented from deteriorating by applying heat generated from the integrated circuits to the GePDs. A type of GePD may be any of a vertical type and a horizontal type illustrated in FIGS. 1 to 4.

Hereinafter, embodiments of the present invention will be described in detail with reference to the drawings.

Example 1

Figure 1:
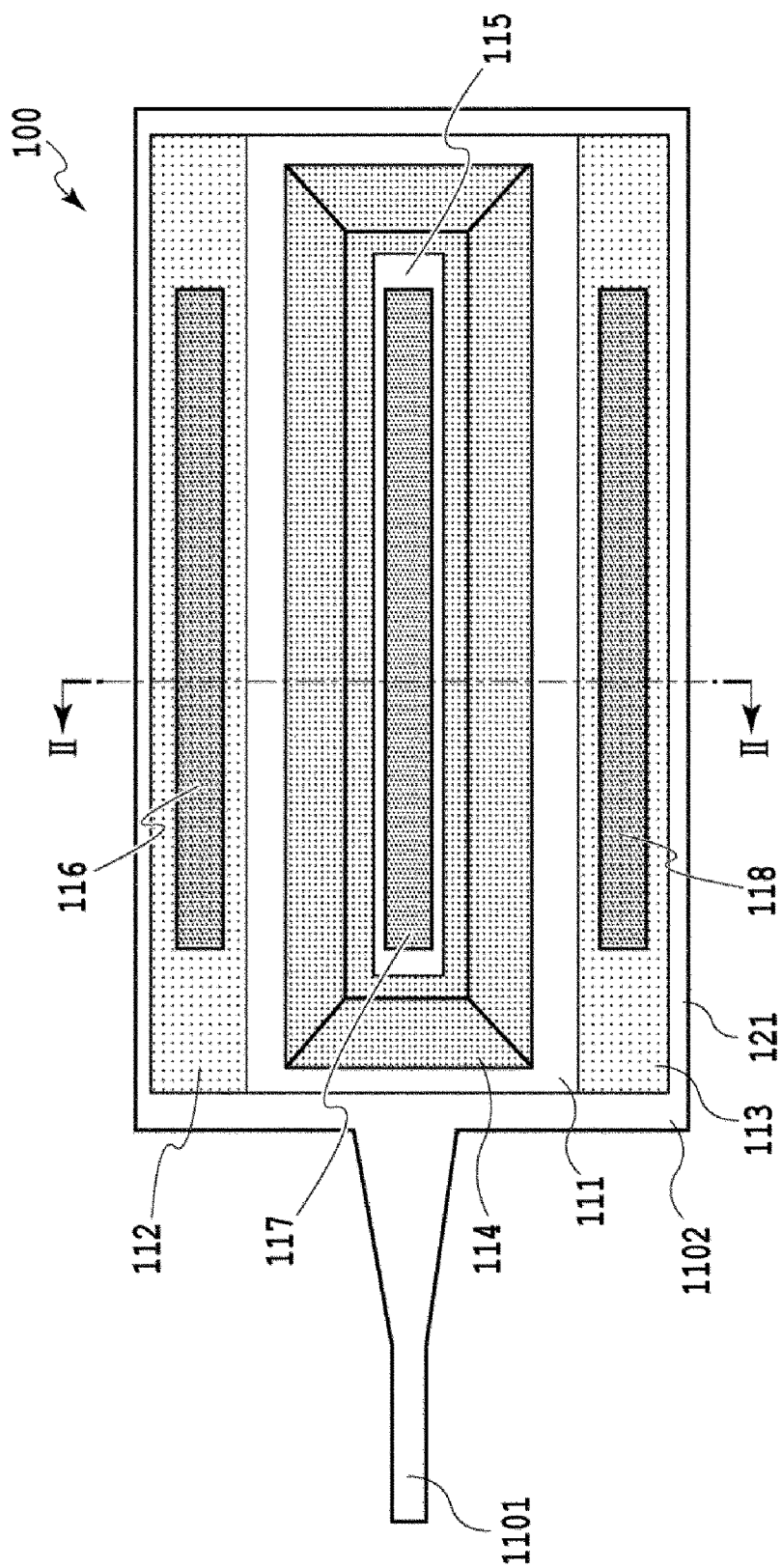
FIG. 1 is a plan view of a substrate of a typical vertical GePD of the related art.
Figure 2:
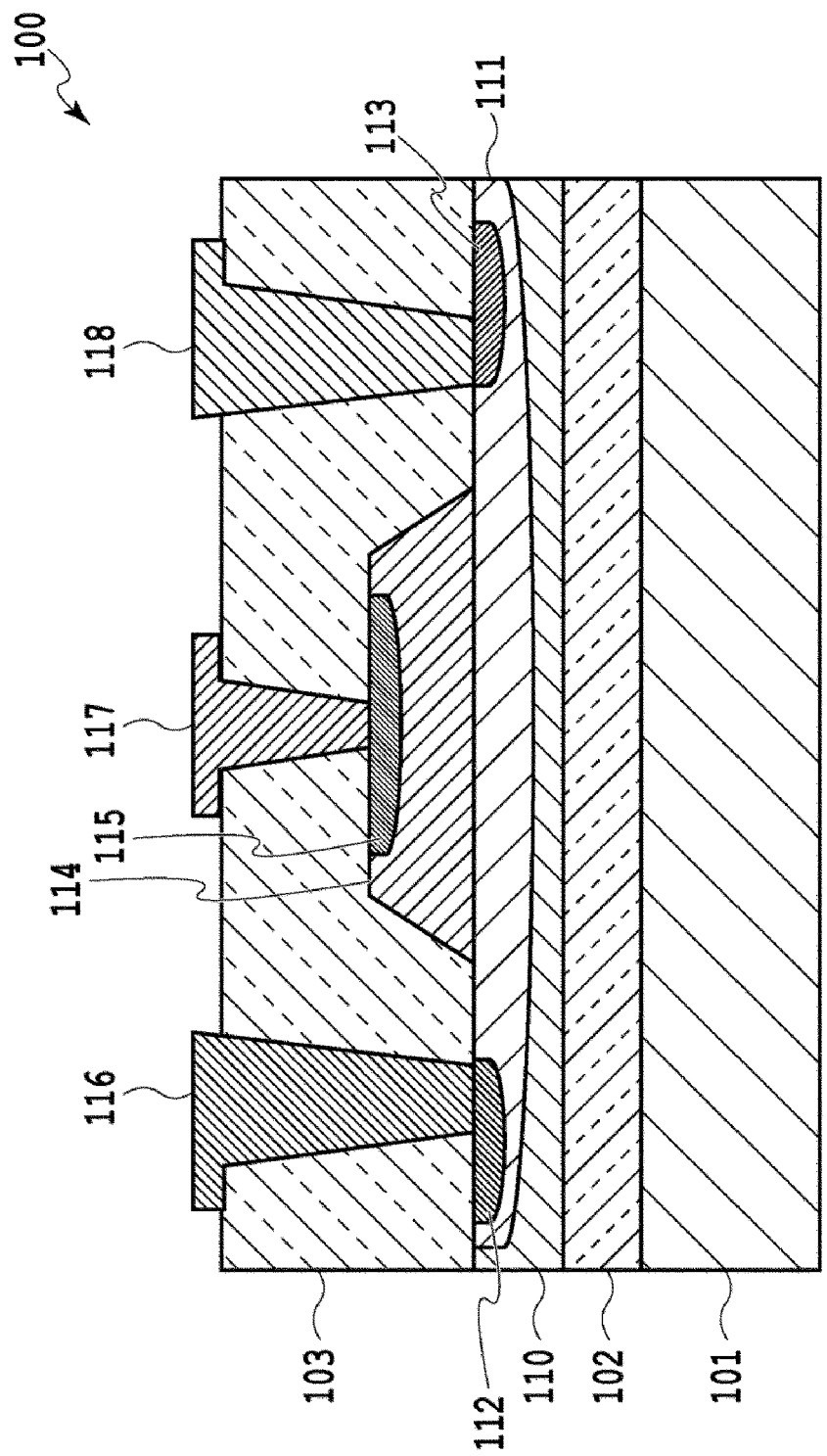
FIG. 2 is a cross-sectional view of a substrate of a GePD in FIG. 1.
Figure 3:
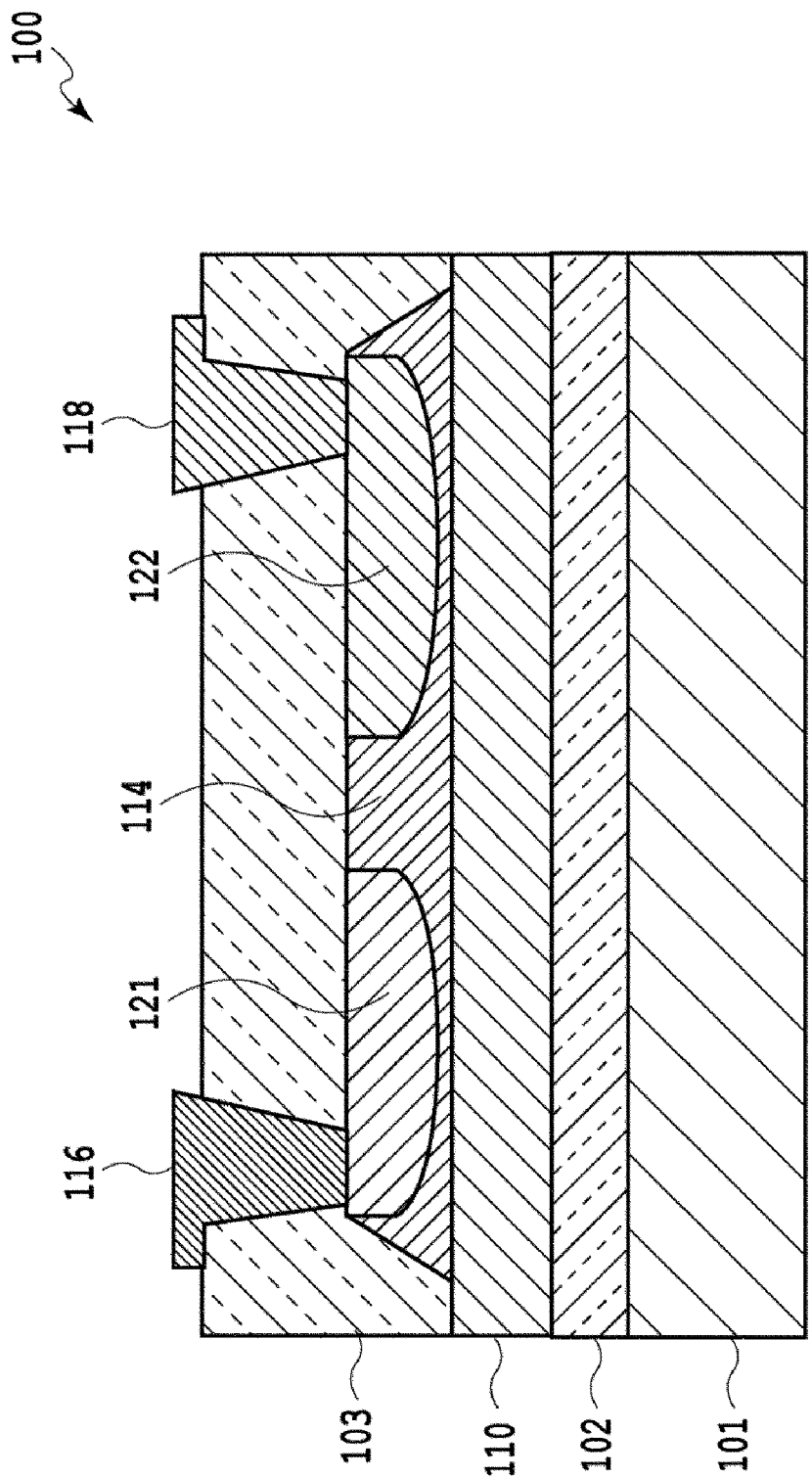
FIG. 3 is a cross-sectional view of a substrate of a typical horizontal GePD of the related art.
Figure 4:
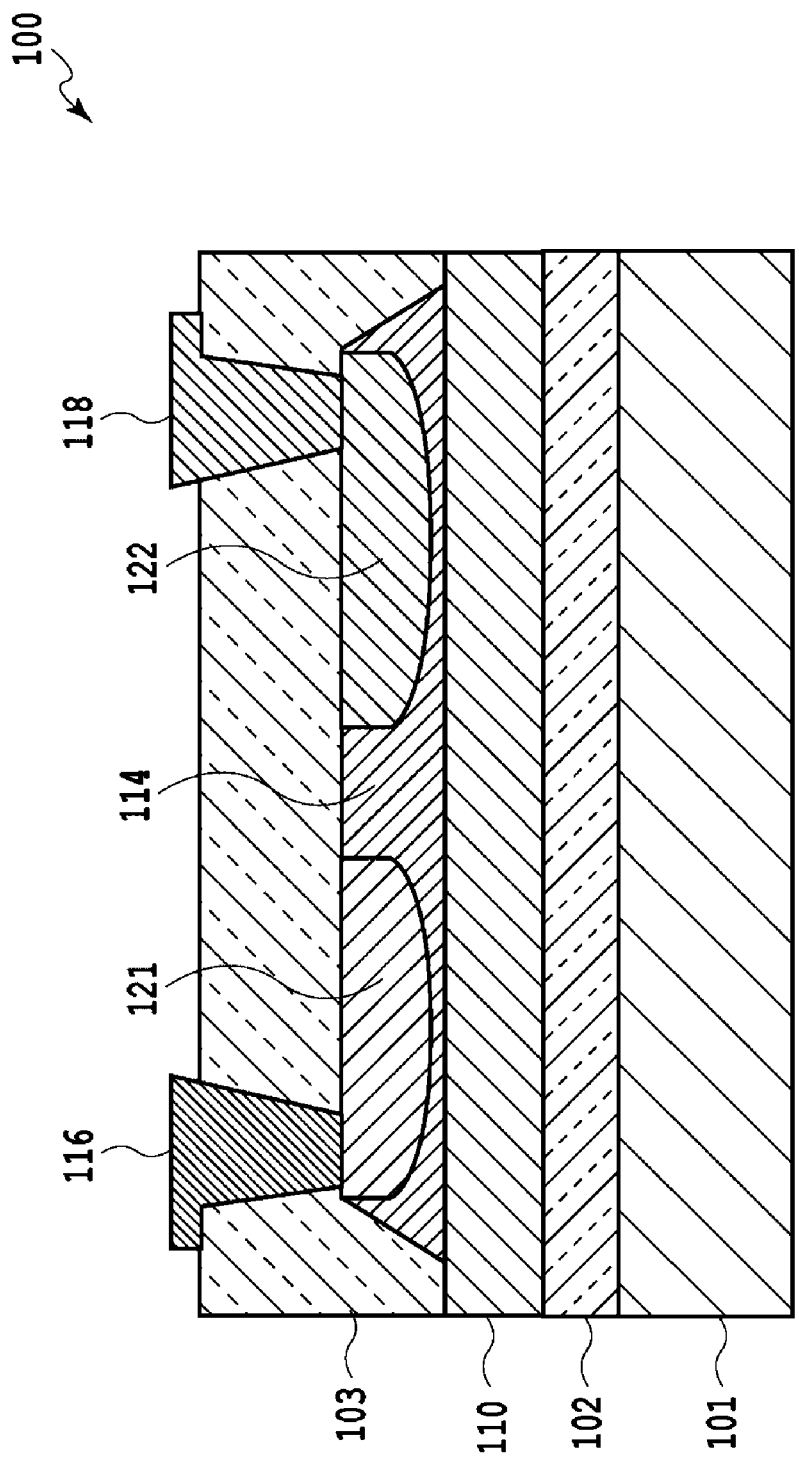
FIG. 4 is a cross-sectional view of a substrate of another example of the typical horizontal GePD of the related art.
Figure 5:
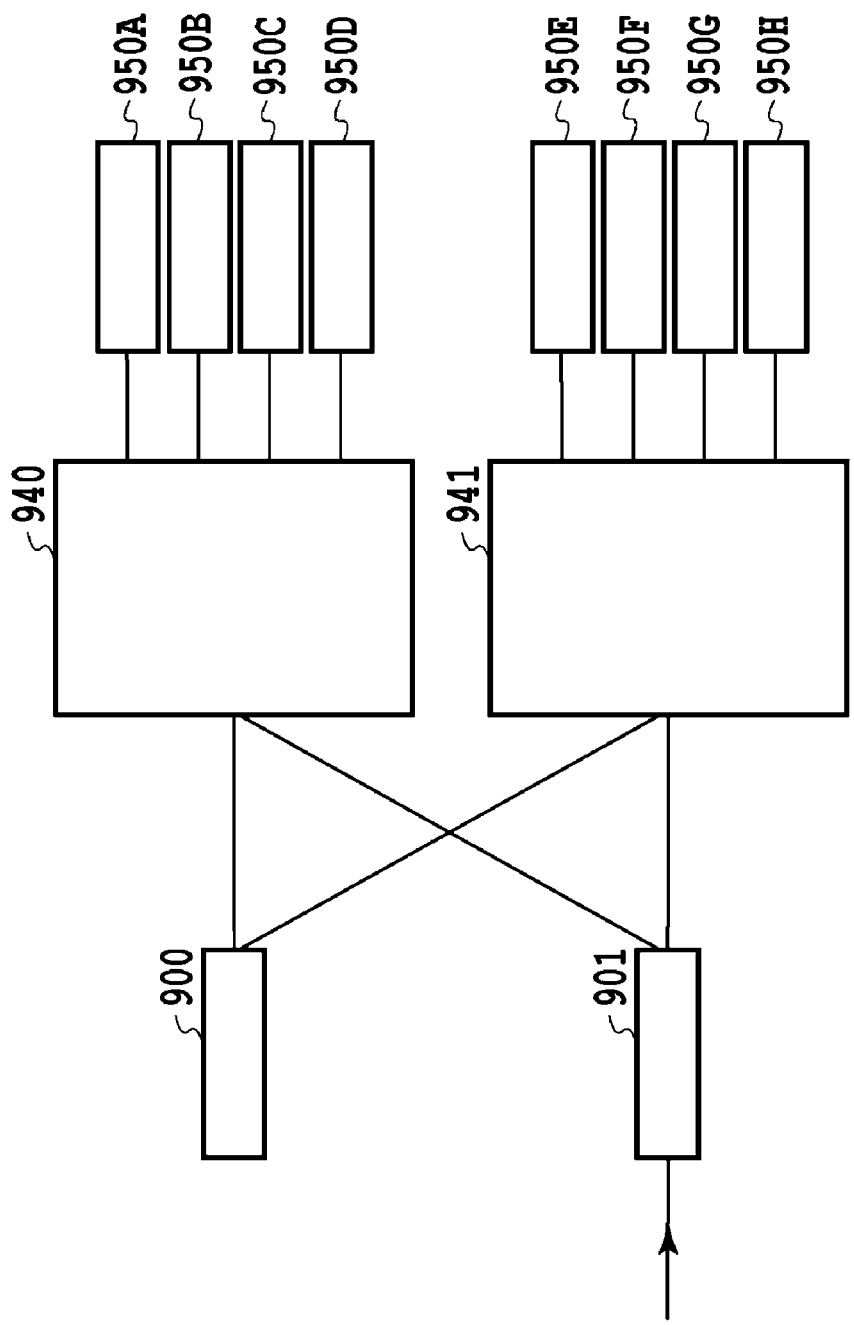
FIG. 5 is a diagram illustrating an example of a configuration of an optical receiver of the related art that is used in an optical digital coherent communication technology.
Figure 6:
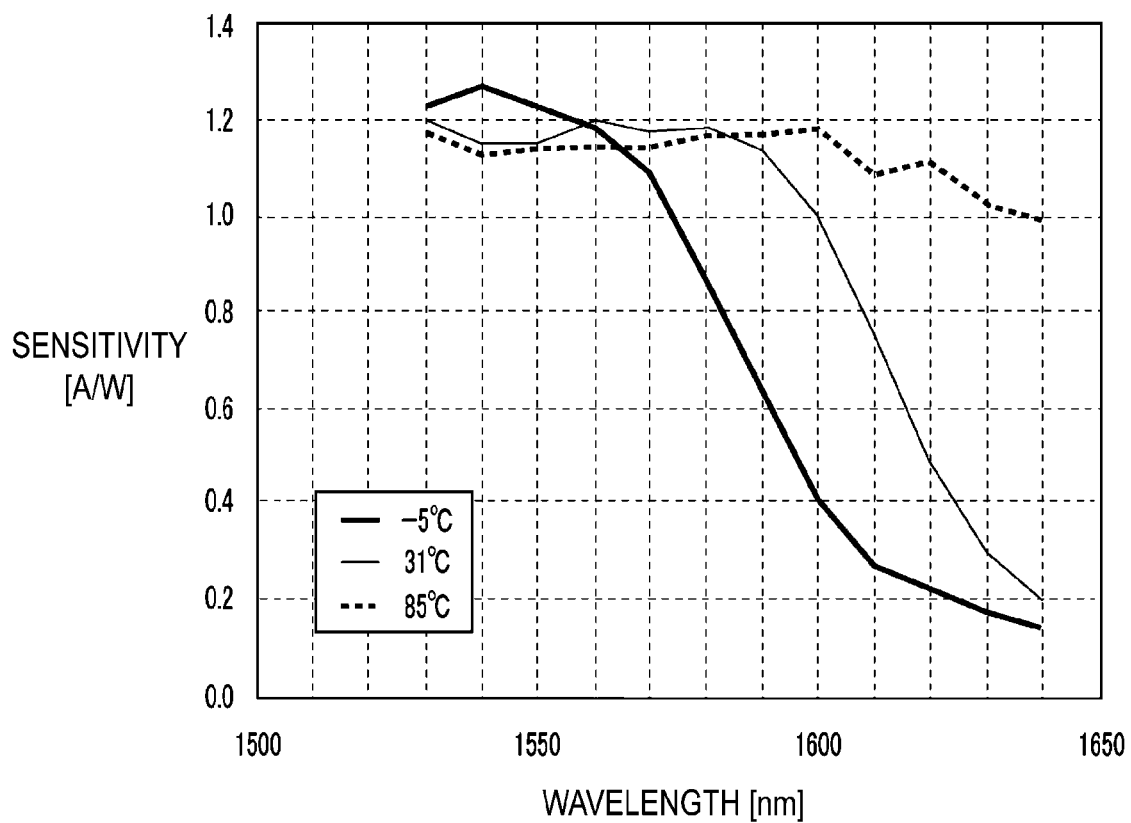
FIG. 6 is a diagram illustrates wavelength characteristics of photoelectric sensitivity at three temperatures of a GePD of the related art.
Figure 7:
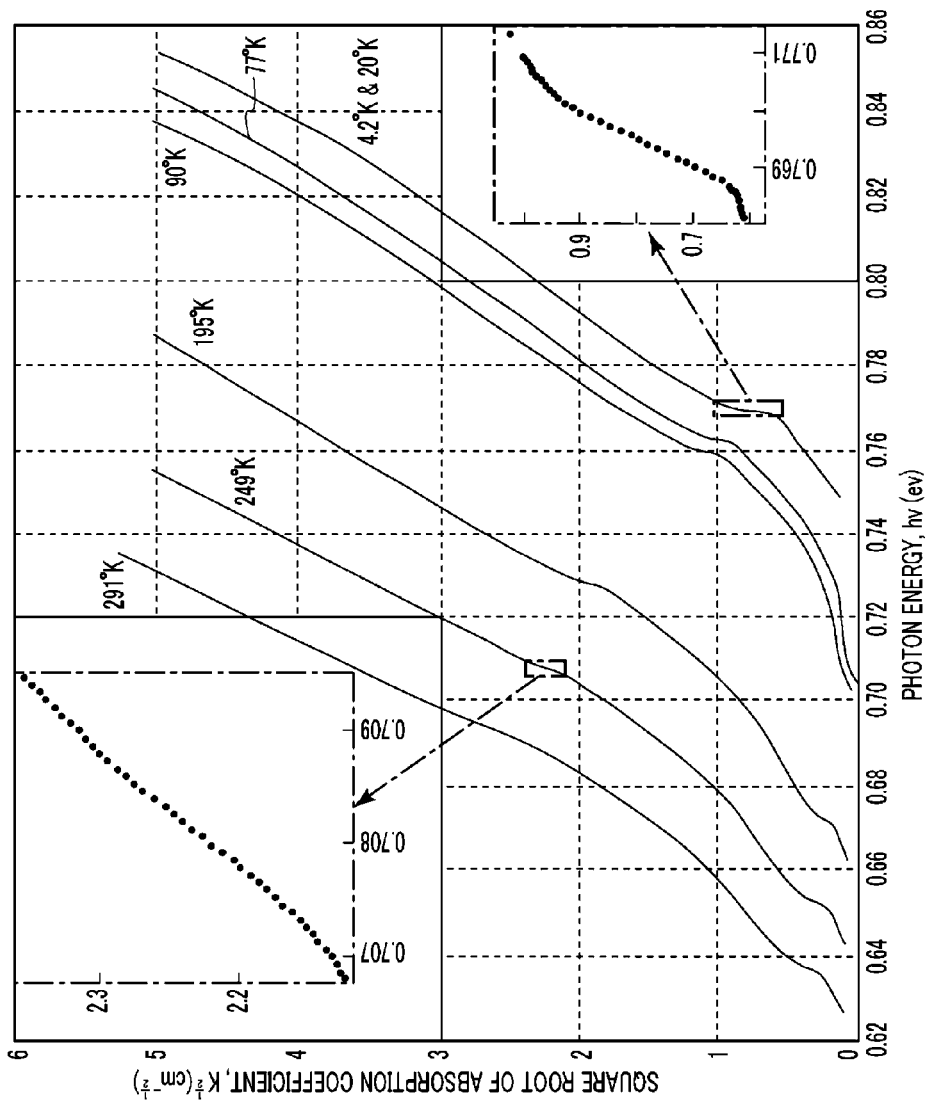
FIG. 7 is a diagram illustrating temperature dependence of a light absorption spectrum of Ge.
Figure 8:
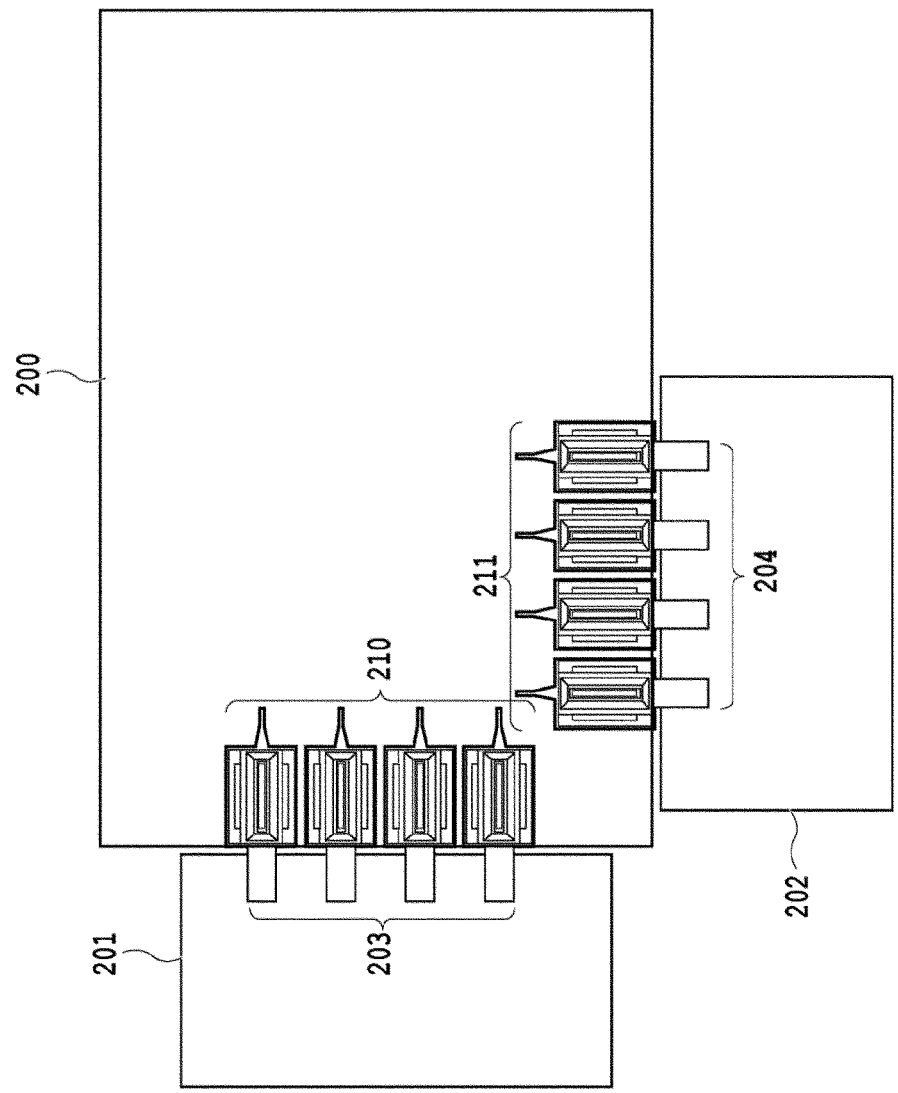
FIG. 8 is a diagram illustrating a configuration of a photodetector according to Example 1 of the present invention.

FIG. 8 illustrates a typical arrangement example of a photodetector of Example 1 of the present invention. In the photodetector of the present invention, integrated circuits 201 and 202 are arranged to surround two GePD groups 210 and 211 at one corner of a silicon photonics chip 200 in which the two GePD groups 210 and 211 are arranged in the one corner. The GePD group 210 is arranged in correspondence to the integrated circuit 201 and the GePD group 211 is arranged in correspondence to the integrated circuit 202, and GePDs in each GePD group are arranged equidistantly from each integrated circuit.

Typically, when a plurality of GePDs are arranged, the integrated circuit has multiple channels or performs a differential operation in most cases and, for example, in Example 1, such an arrangement is the same as that when transimpedance amplifiers performing a differential operation of two channels are the integrated circuits 201 and 202. Wirings connecting the integrated circuits 201 and 202 to the GePD groups 210 and 211 may be wire bonding or may be flip chip connection using metal bumps. The integrated circuits 201 and 202 are heat sources, and heat generated by the integrated circuits 201 and 202 is transmitted to the GePD groups 210 and 211 through the connection wirings.

Figure 9:
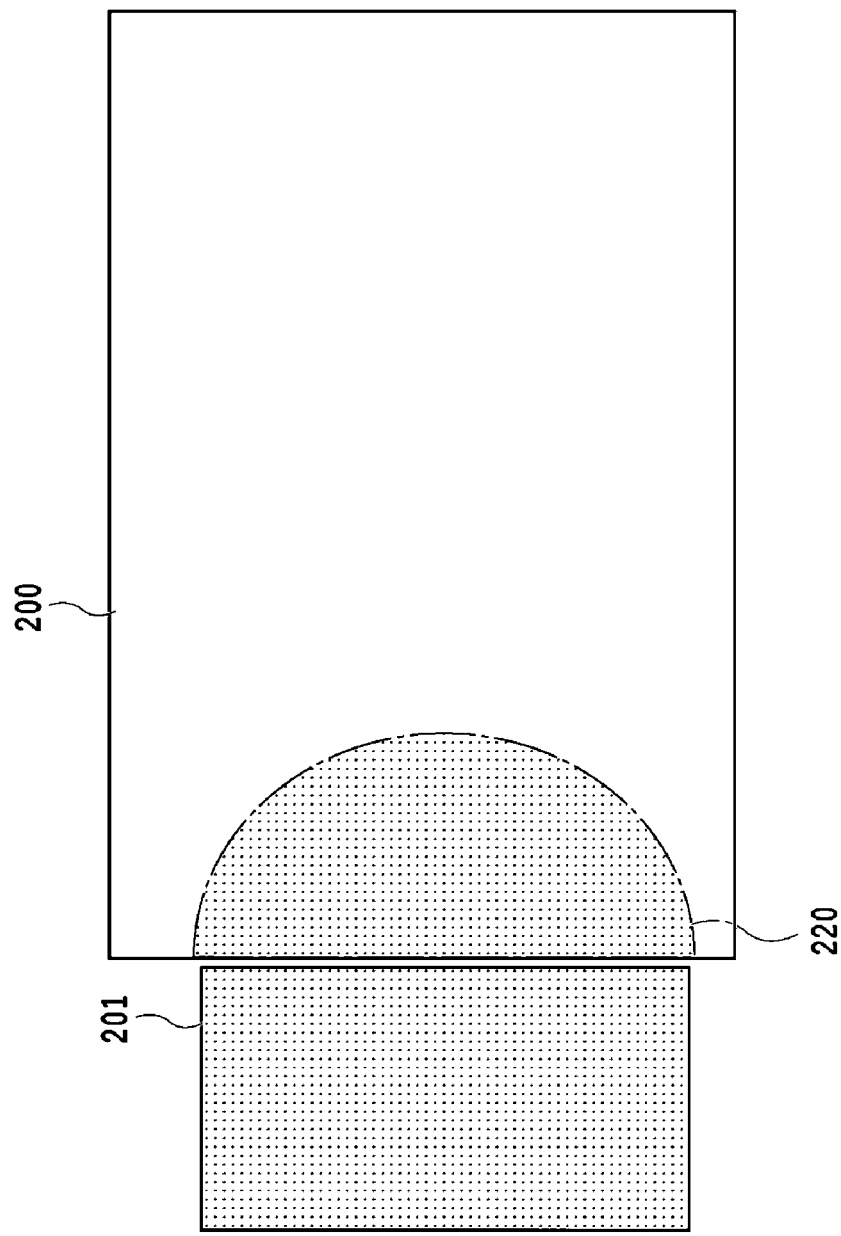
FIG. 9 is a diagram illustrating a heat distribution in a silicon photonics chip of the related art.

In a typical arrangement of photodetectors of the related art, one GePD group is arranged on one side of one square chip 200. Thus, there is one integrated circuit 201 as a heat source, and a distribution of a temperature due to diffused heat is a temperature distribution 220 in FIG. 9.

Figure 10:
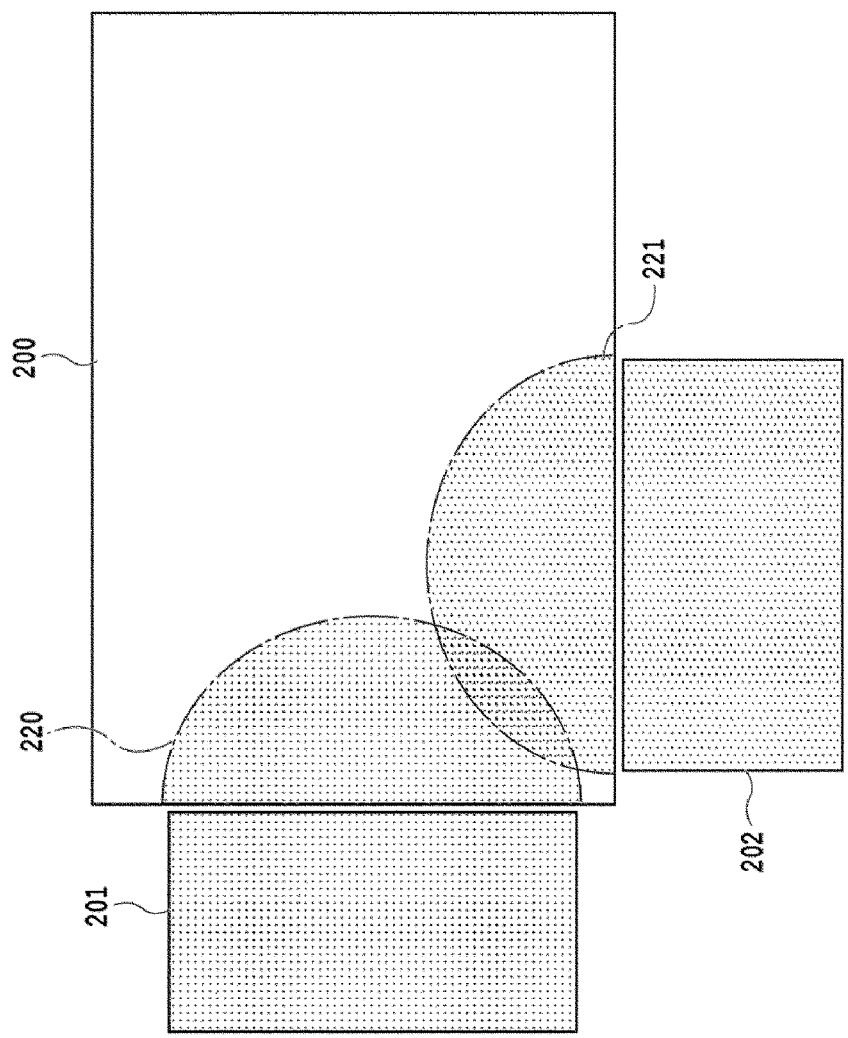
FIG. 10 is a diagram illustrating a heat distribution in a silicon photonics chip of the present invention.

On the other hand, in the arrangement of the photodetector of the present invention, there are two integrated circuits 201 and 202 serving as heat sources in correspondence to the GePD groups in FIG. 10, there are also two temperature distributions 220 and 221 as heat distributions caused by heat diffusion, and heat is generated to surround the GePD arrangement. Thus, the heat is efficiently concentrated in a corner of the chip 200. When the GePD groups 210 and 211 are arranged at this corner, the heat of the integrated circuits 201 and 202 can be efficiently applied to the GePD groups. This heat warms the GePD groups and sensitivity is not reduced. According to the present invention, it is possible to apply the heat to GePDs more efficiently as compared with the arrangement of the related art by simply changing the arrangement of the integrated circuits without requiring an additional circuit.

Example 2

Figure 11:
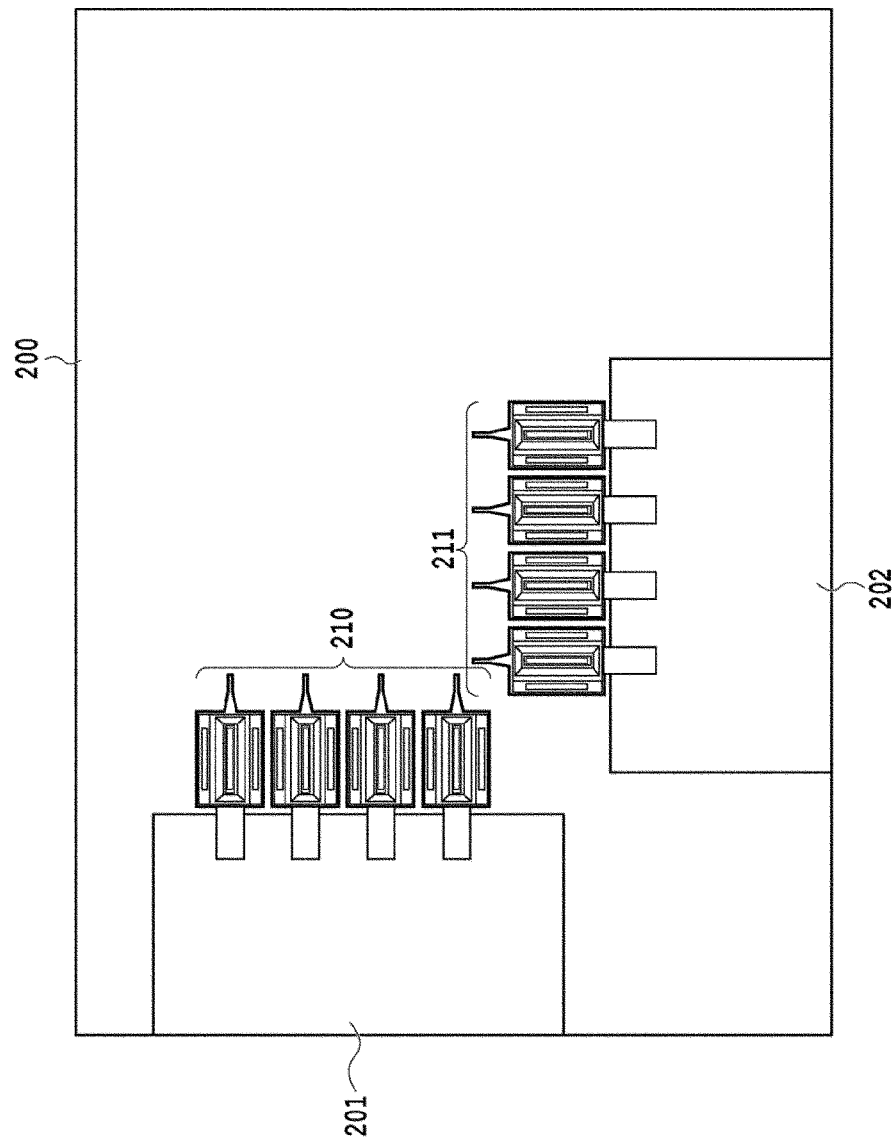
FIG. 11 is a plan view of a substrate illustrating a configuration of a photodetector according to Example 2 of the present invention.

FIG. 11 is a diagram illustrating a configuration of Example 2 of the present invention. Example 2 is an example in which integrated circuits 201 and 202 are monolithically integrated on a silicon substrate of the silicon photonics chip 200. GePD groups are arranged to be surrounded by the integrated circuits 201 and 202 monolithically integrated on the silicon photonics chip 200. A GePD group 210 is arranged so as to be equidistant from the integrated circuit 201. A GePD group 211 is arranged so as to be equidistant from the integrated circuit 202. Because the integrated circuits 201 and 202 are monolithically integrated, it is not necessary for the number of integrated circuits to be two, and there may be three or more integrated circuits.

Figure 12:
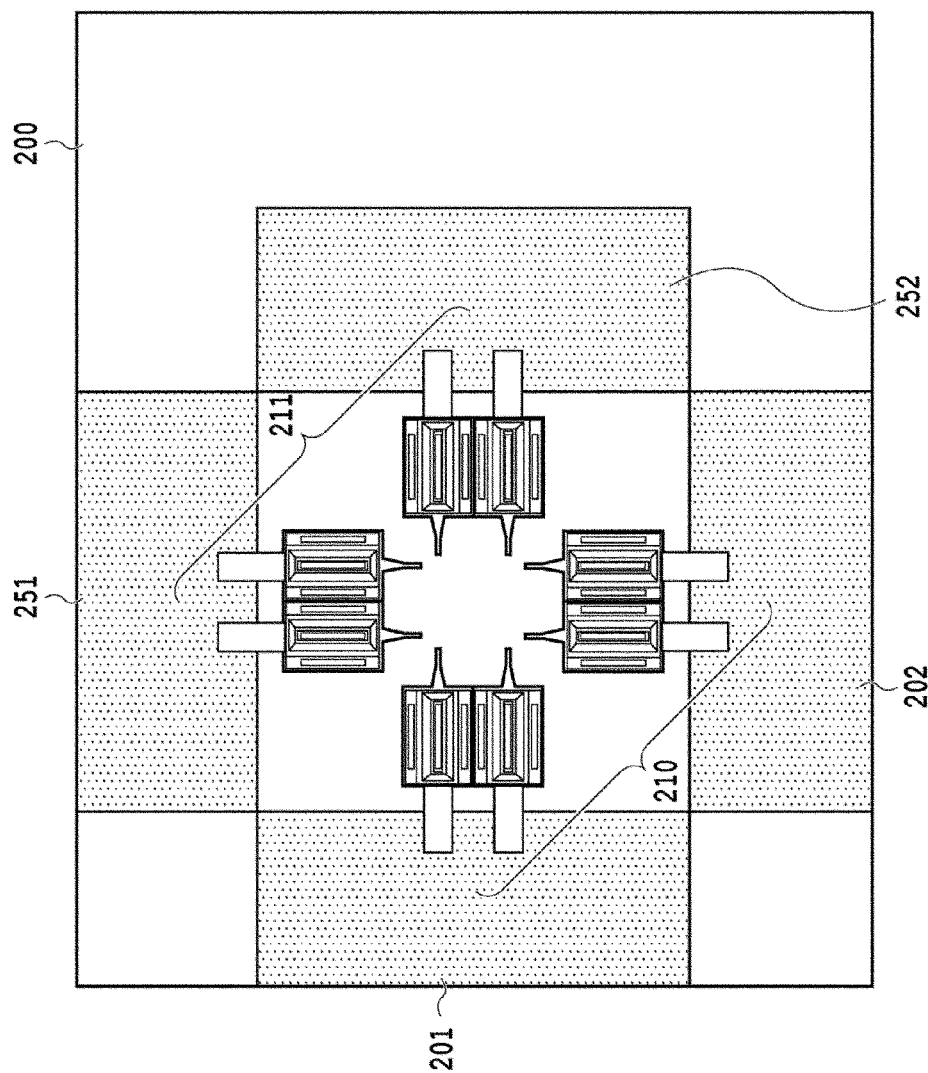
FIG. 12 is a plan view of a substrate illustrating another configuration of the photodetector according to Example 2 of the present invention.

For example, an example in which there are three or more integrated circuits is also possible, as in another configuration of Example 2 illustrated in FIG. 12. In FIG. 12, a structure in which four integrated circuits 201, 202, 251, and 252 are arranged to surround the GePD groups 210 and 211 arranged in a form in which electrical wirings thereof are put out in four directions at a center of the silicon photonics chip 200, such that heat is applied is adopted. Distances between respective GePDs in the GePD groups 210 and 211 and the four integrated circuits 201, 202, 251, and 252 are the same so that heat applied from the respective integrated circuits becomes uniform.

Wirings connecting the integrated circuits 201, 202, 251, and 252 to the GePD groups 210 and 211 are metals wired in the upper clad layer 103. Because the integrated circuits 201, 202, 251, and 252 are monolithically integrated, heat from the four integrated circuits 201, 202, 251, and 252, which are heat sources, is transmitted to the respective GePDs through not only metal wirings but also the substrate serving as a conduction path.

On the other hand, a structure in which one or any of integrated circuits may be arranged at a center of the silicon photonics chip, and heat is applied to any of a plurality of GePD groups arranged around the integrated circuits to surround the integrated circuits can be achieved.

Example 3

Figure 13:
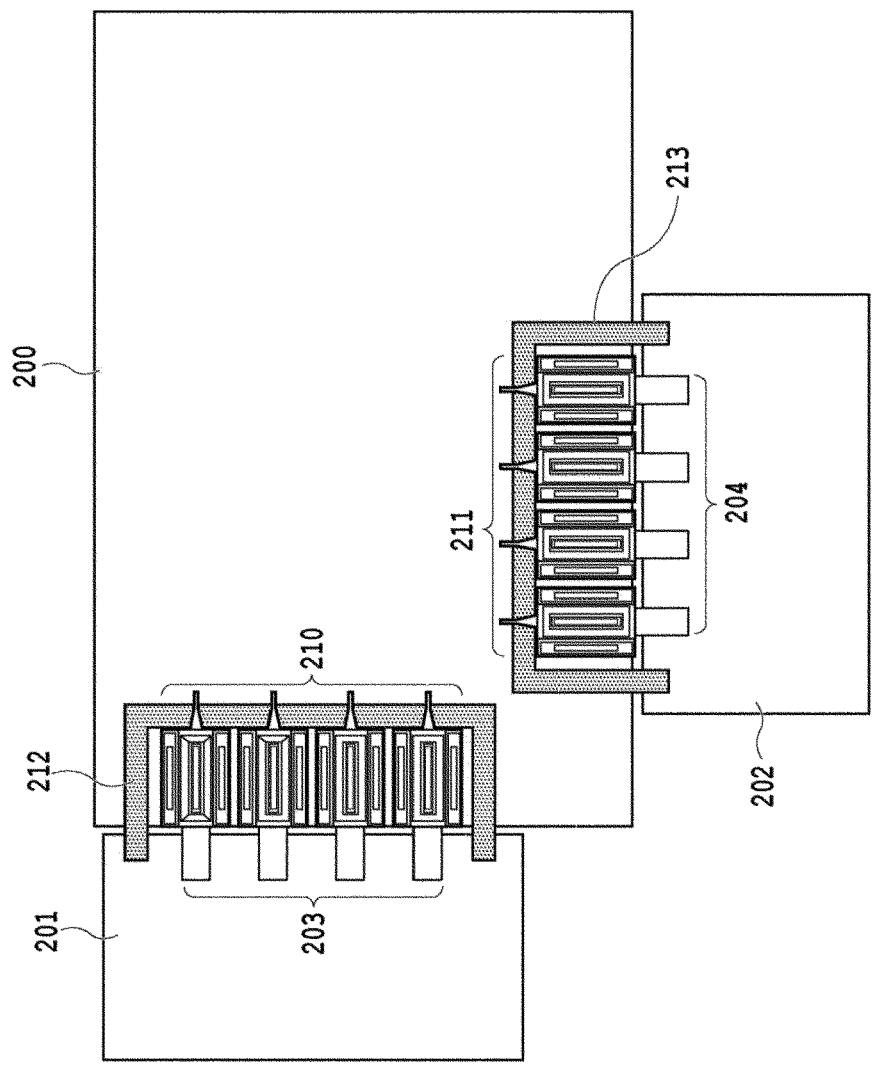
FIG. 13 is a plan view of a substrate illustrating a configuration of a photodetector according to Example 3 of the present invention.

FIG. 13 is a diagram illustrating a configuration of Example 3 of the present invention. This is an example in which thermal conductors 212 and 213 other than electrical wirings are added, in addition to the arrangement of Example 1. The thermal conductors 212 and 213 are wired from the integrated circuits 201 and 202 and serve as heat pumps that transmit heat from the integrated circuits. The thermal conductors 212 and 213 can be metals or highly thermal conductive materials wired in or on the upper clad layer 103 and can be wirings having a sufficient thermal conductivity and thickness or width to secure a desired thermal conductivity. In Example 3, because a main purpose is to apply the heat generated by the integrated circuits 201 and 202 to the GePD groups 210 and 211, the thermal conductors 212 and 213 are arranged to surround the GePD groups.

Example 4

Figure 14:
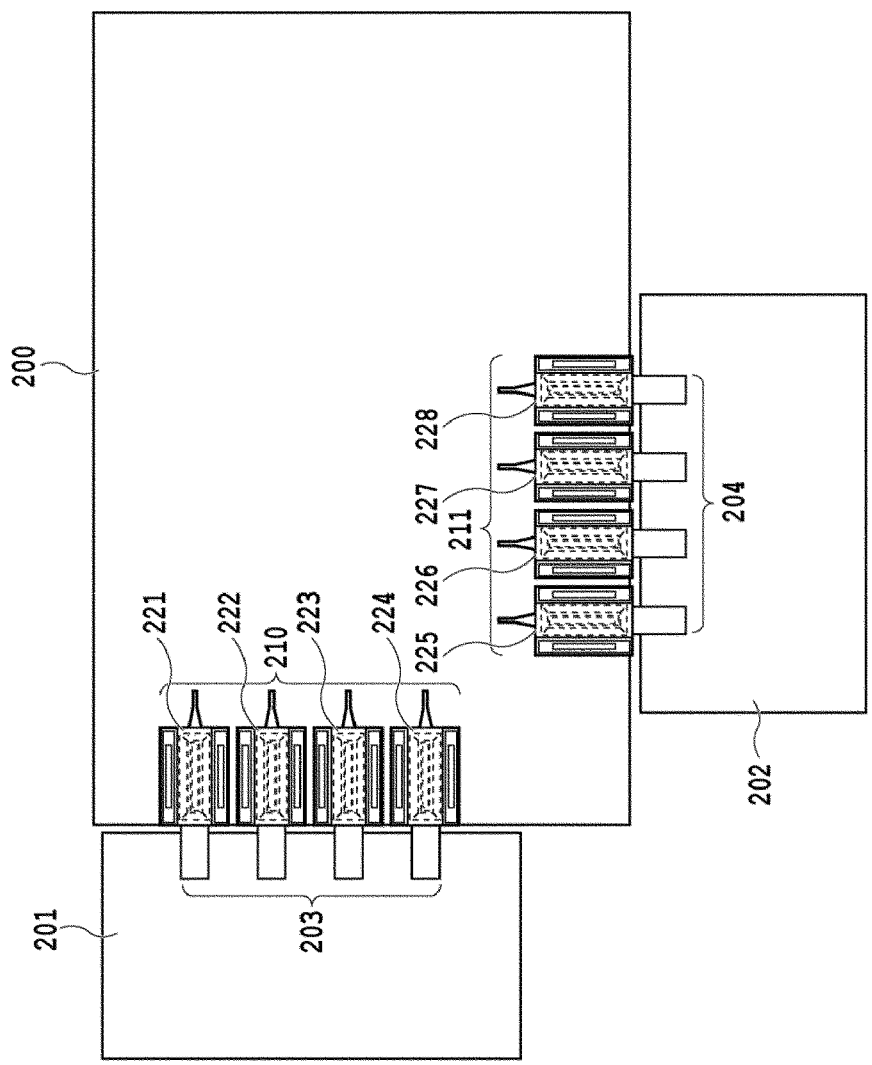
FIG. 14 is a plan view of a substrate illustrating a configuration of a photodetector according to Example 4 of the present invention.

FIG. 14 is a diagram illustrating a configuration of Example 4 of the present invention. Example 4 is an example in which heaters 221 to 228 are arranged, in addition to the arrangement of Example 1. This is an example in which a heater for applying auxiliary heat is arranged when the heat from the integrated circuits 201 and 202 is insufficient to heat the GePD groups 210 and 211.

Figure 16:
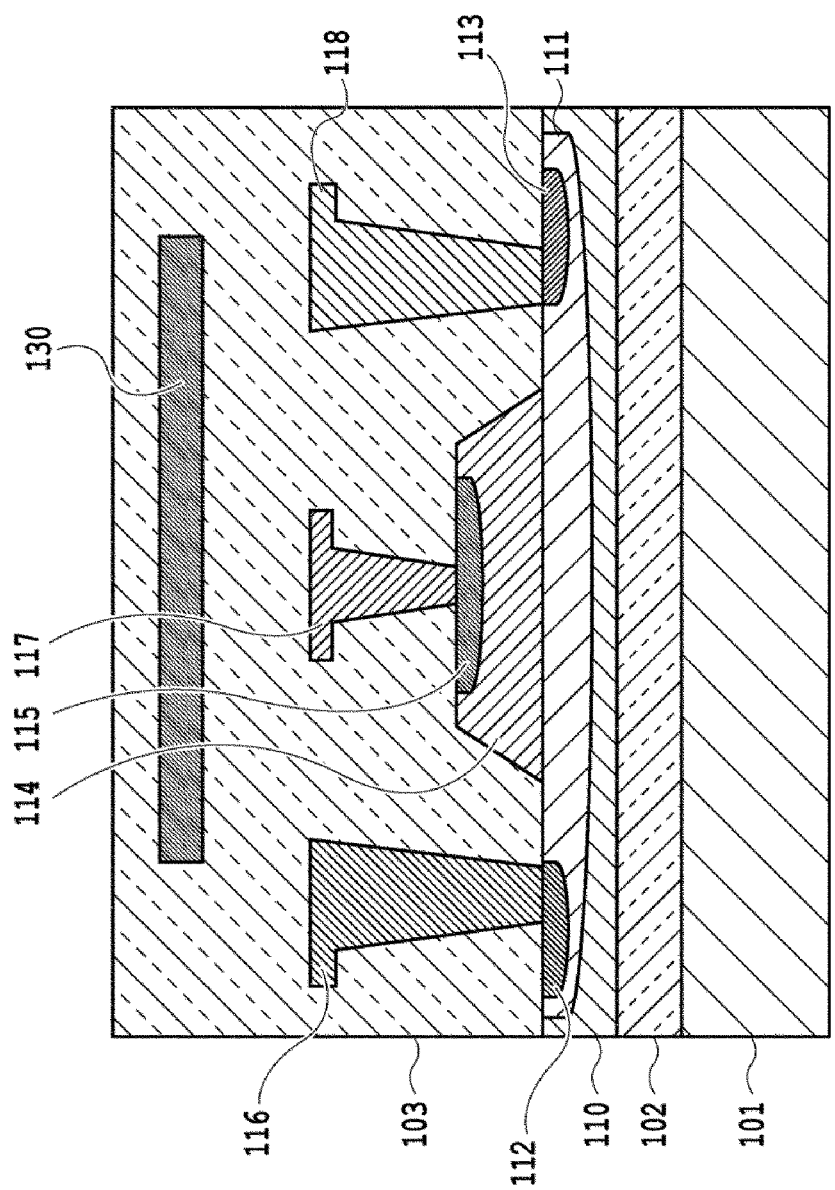
FIG. 16 is a cross-sectional view of a substrate of a GePD of the photodetector in Example 4 of the present invention.

The heaters 221 to 228 of Example 4 are regions of resistors covering germanium layers of the respective GePDs in the configuration of FIG. 14, and can be configured of a heater 130 formed with a metal or a metal compound wired in the upper clad layer 103 of the GePD, as illustrated in a cross-sectional view of the substrate of FIG. 16.

Figure 15:
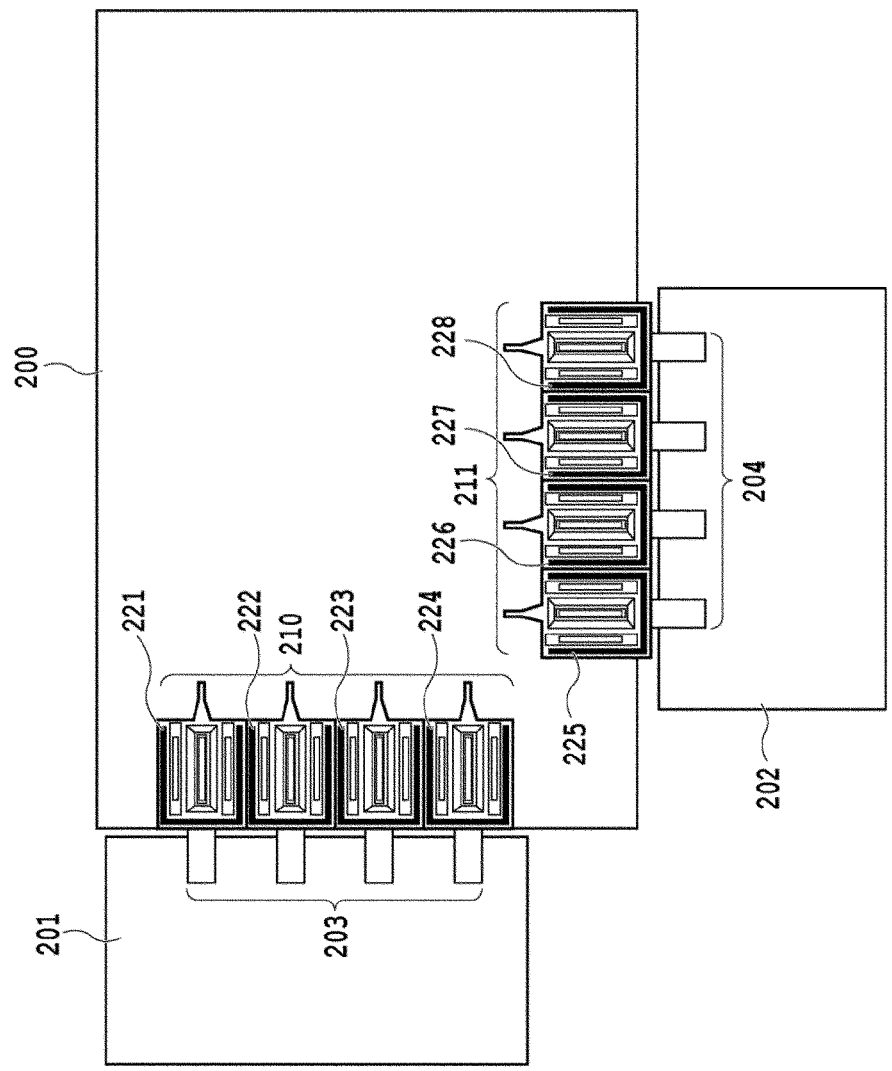
FIG. 15 is a plan view of a substrate illustrating another configuration of the photodetector according to Example 4 of the present invention.
Figure 17:
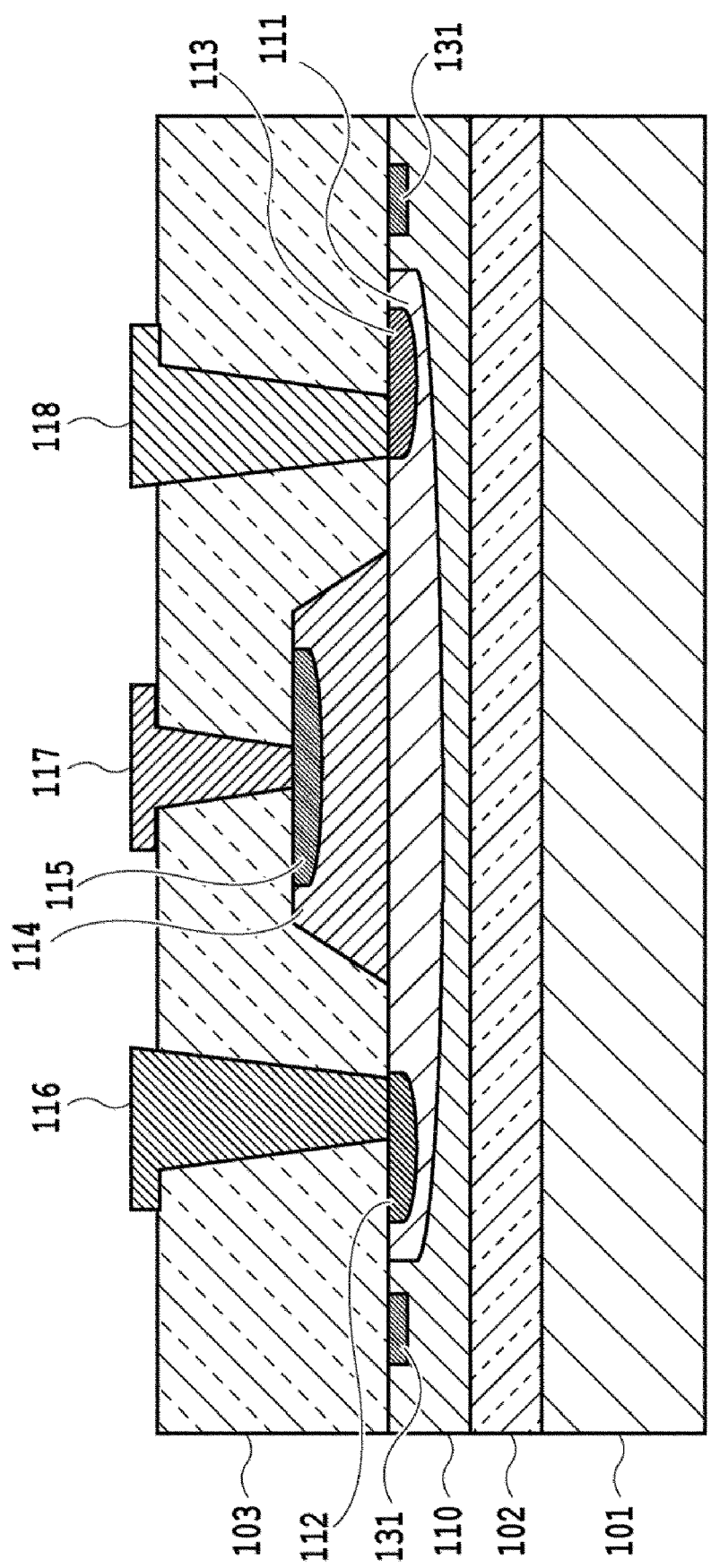
FIG. 17 is a cross-sectional view of a substrate of another configuration of the GePD of the photodetector in Example 4 of the present invention.

Further, the heaters 221 to 228 of Example 4 are regions of linear resistors surrounding the germanium layers of the respective GePDs in the configuration of FIG. 15, and can also be configured as a heater 131 formed with a linear conductive region prepared by adding impurities to the core layer 110 of the GePD, as illustrated in a cross-sectional view of the substrate of FIG. 17.

INDUSTRIAL APPLICABILITY

As described above, according to the present invention, it is possible to provide a photodetector having small change in light sensitivity by curbing change in a temperature of the GePD using the heat generated by the integrated circuits in a photodetector using GePDs.

REFERENCE SIGNS LIST 100, 950A to 950H Germanium photodetector (GePD)
101 Silicon (Si) substrate
102 Lower clad layer
103 Upper clad layer
110 (Silicon) Core layer
111 p-type Si slab
112, 113, p++ Si electrode portion
114 Germanium (Ge) layer
115, n-type germanium (Ge) region
116, 117, 118 Electrode
121 p-type germanium region
122 n-type germanium region
123 Region
124$p$ p-type silicon region
124$n$ n-type silicon region
125 Silicon electrode portion
1101 Waveguide layer
1102 Silicon slab
130, 131, 221 to 228 Resistor (heater)
200 Silicon photonics chip
201, 202, 251, 252 Integrated circuit
210, 211 GePD group
220, 221 Temperature distribution
212, 213 Thermal conductor
900 Local light emitting source
901 Polarized wave separator
940, 941 Optical hybrid

The invention claimed is:

1. A photodetector comprising:
a first group of photodiodes and a second group of photodiodes formed on a silicon substrate and including a germanium layer as a light absorption layer, the first and second groups of photodiodes being an entirety of the photodiodes formed on the silicon substrate, the first group of photodiodes being formed orthogonal to the second group of photodiodes on the silicon substrate; and
two integrated circuits arranged parallel to two sides connected to one corner of the silicon substrate, respectively, wherein each of the two integrated circuits is connected to two or more photodiodes of the first and second groups of photodiodes formed on the silicon substrate, an integrated circuit of the two integrated circuits is arranged equidistantly from each of the two or more photodiodes, and the number of the two or more photodiodes corresponding to each of the two integrated circuits is equal.

2. The photodetector according to claim 1,
wherein a photodiode of the first and second groups of photodiodes includes
a silicon substrate;
a lower clad layer formed on the silicon substrate;
a silicon core layer formed on the lower clad layer and including a silicon region doped with impurities having a first conductivity type;
a silicon waveguide layer connected to the silicon core layer;
a germanium layer formed on the silicon core layer and including a region doped with impurities having a second conductivity type;
an upper clad layer formed on the silicon core layer and the germanium layer; and
electrodes connected to the silicon region and the region of the germanium layer, respectively.

3. The photodetector according to claim 2,
wherein the photodiode includes a heater for applying heat to the germanium layer, and
the heater is arranged in or on the upper clad layer.

4. The photodetector according to claim 2,
wherein the photodiode includes a heater for applying heat to the germanium layer, and
the heater is a linear conductive region formed in an upper portion of the silicon core layer.

5. The photodetector according to claim 1,
wherein a photodiode of the first and second groups of photodiodes includes
a silicon substrate;
a lower clad layer formed on the silicon substrate;
a silicon core layer formed on the lower clad layer;
a silicon waveguide layer connected to the silicon core layer;
a germanium layer formed on the silicon core layer and including two germanium regions doped with impurities having different conductivity types;
an upper clad layer formed on the silicon core layer and the germanium layer; and
electrodes connected to the two germanium regions of the germanium layer, respectively.

6. The photodetector according to claim 5,
wherein the photodiode includes a heater for applying heat to the germanium layer, and
the heater is arranged in or on the upper clad layer.

7. The photodetector according to claim 5,
wherein the photodiode includes a heater for applying heat to the germanium layer, and
the heater is a linear conductive region formed in an upper portion of the silicon core layer.

8. The photodetector according to claim 1,
wherein a photodiode of the first and second groups of photodiodes includes
a silicon substrate;
a lower clad layer formed on the silicon substrate;
a silicon core layer formed on the lower clad layer and including two silicon regions doped with impurities having different conductivity types;
a silicon waveguide layer connected to the silicon core layer;
a germanium layer formed over the two silicon regions on the silicon core layer;
an upper clad layer formed on the silicon core layer and the germanium layer; and
electrodes connected to the two silicon regions, respectively.

9. The photodetector according to claim 8,
wherein the photodiode includes a heater for applying heat to the germanium layer, and
the heater is arranged in or on the upper clad layer.

10. The photodetector according to claim 8,
wherein the photodiode includes a heater for applying heat to the germanium layer, and
the heater is a linear conductive region formed in an upper portion of the silicon core layer.

11. The photodetector according to claim 1,
wherein the integrated circuit includes a thermal conductor arranged to surround the two or more photodiodes connected to the integrated circuit, and
the thermal conductor is a metal or a highly thermal conductive material arranged in or on the upper clad layer.

12. A photodetector comprising:
a first group of photodiodes and a second group of photodiodes formed on a silicon substrate and including a germanium layer as a light absorption layer, the first and second groups of photodiodes being an entirety of the photodiodes formed on the silicon substrate, the first group of photodiodes being formed orthogonal to the second group of photodiodes on the silicon substrate; and
two or more integrated circuits monolithically integrated on the silicon substrate,
wherein each of the two or more integrated circuits is connected to two or more photodiodes of the first and second groups of photodiodes formed on the silicon substrate,
an integrated circuit of the two or more integrated circuits is arranged equidistantly from each of the two or more photodiodes, and
the number of the two or more photodiodes corresponding to each of the two or more integrated circuits is equal.

13. The photodetector according to claim 12,
wherein a photodiode of the first and second groups of photodiodes includes
a silicon substrate;
a lower clad layer formed on the silicon substrate;
a silicon core layer formed on the lower clad layer and including a silicon region doped with impurities having a first conductivity type;
a silicon waveguide layer connected to the silicon core layer;
a germanium layer formed on the silicon core layer and including a region doped with impurities having a second conductivity type;
an upper clad layer formed on the silicon core layer and the germanium layer; and
electrodes connected to the silicon region and the region of the germanium layer, respectively.

14. The photodetector according to claim 12,
wherein a photodiode of the first and second groups of photodiodes includes
a silicon substrate;
a lower clad layer formed on the silicon substrate;
a silicon core layer formed on the lower clad layer;

a silicon waveguide layer connected to the silicon core layer;

a germanium layer formed on the silicon core layer and including two germanium regions doped with impurities having different conductivity types;

an upper clad layer formed on the silicon core layer and the germanium layer; and electrodes connected to the two germanium regions of the germanium layer, respectively.

15. The photodetector according to claim 12, wherein a photodiode of the first and second groups of photodiodes includes a silicon substrate;

a lower clad layer formed on the silicon substrate;

a silicon core layer formed on the lower clad layer and including two silicon regions doped with impurities having different conductivity types;

a silicon waveguide layer connected to the silicon core layer;

a germanium layer formed over the two silicon regions on the silicon core layer;

an upper clad layer formed on the silicon core layer and the germanium layer; and electrodes connected to the two silicon regions, respectively.

16. The photodetector according to claim 12, wherein the integrated circuit includes a thermal conductor arranged to surround the two or more photodiodes connected to the integrated circuit, and the thermal conductor is a metal or a highly thermal conductive material arranged in or on the upper clad layer.

* * * * *